(12) United States Patent
Cho et al.

(10) Patent No.: US 8,799,844 B2
(45) Date of Patent: Aug. 5, 2014

(54) LAYOUT DECOMPOSITION METHOD AND APPARATUS FOR MULTIPLE PATTERNING LITHOGRAPHY

(75) Inventors: Minsik Cho, Cedar Park, TX (US); Xiaoping Tang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 456 days.

(21) Appl. No.: 13/016,033

(22) Filed: Jan. 28, 2011

(65) Prior Publication Data

US 2012/0196230 A1    Aug. 2, 2012

(51) Int. Cl.
*G06F 17/50* (2006.01)
(52) U.S. Cl.
USPC ............................................. 716/116; 716/55
(58) Field of Classification Search
USPC ................................................... 716/116, 55
See application file for complete search history.

(56) References Cited

U.S. PATENT DOCUMENTS

| | | | |
|---|---|---|---|
| 7,802,226 B2 | 9/2010 | Park et al. | |
| 2008/0307381 A1 | 12/2008 | Tritchkov et al. | |
| 2010/0021055 A1 | 1/2010 | Socha | |
| 2010/0037200 A1 | 2/2010 | Ghan et al. | |
| 2010/0229145 A1 | 9/2010 | Sahouria et al. | |

OTHER PUBLICATIONS

"Double Patterning Technology Friendly Detailed Routing", Cho et al., Nov. 2008, Computer-Aided Design, IEEE/ACM International Conference, pp. 506-511.*
A.B. Kahng et al., "Layout Decomposition for Double Patterning Lithography," IEEE/ACM International Conference on Computer-Aided Design, Nov. 2008, pp. 465-472.
K. Yuan et al., "Double Patterning Layout Decomposition for Simultaneous Conflict and Stitch Minimization," IEEE International Symposium on Physical Design, Mar.-Apr. 2009, pp. 107-114.
J.-S. Yang et al., "A New Graph-Theoretic, Multi-Objective Layout Decomposition Framework for Double Patterning Lithography," 15th Asia and South Pacific Design Automation Conference, Jan. 2010, pp. 637-644, Taipei.
Y. Xu et al., "A Matching Based Decomposer for Double Patterning Lithography," International Symposium on Physical Design, Mar. 2010, pp. 121-126.
M. Gupta et al., "Timing Yield-Aware Color Reassignment and Detailed Placement Perturbation for Bimodal CD Distribution in Double Patterning Lithography," IEEE Transactions on Computer-Aided Design of Integrated Circuits and Systems, Aug. 2010, pp. 1229-1242, vol. 29, No. 8.
F. Liers et al., "A Simple Max-Cut Algorithm for Planar Graphs," Technical Report, Sep. 2008, pp. 1-16, Germany.
W.-K. Shih et al., "Unifying Maximum Cut and Minimum Cut of a Planar Graph," IEEE Transactions on Computers, May 1990, pp. 694-697, vol. 39, No. 5.

* cited by examiner

*Primary Examiner* — Daborah Chacko Davis
(74) *Attorney, Agent, or Firm* — Preston J. Young; Ryan, Mason & Lewis, LLP

(57) ABSTRACT

An initial layout of at least a portion of a given layer of an integrated circuit design is decomposed into multiple sub-layouts by splitting each of a plurality of shapes of the initial layout into multiple segments, constructing a constraint graph to represent relationships between the segments, reducing the constraint graph to a stitch graph, determining at least one cut line of the stitch graph, and generating a decomposed layout based on the determined cut line. The decomposed layout in an illustrative embodiment includes first and second sub-layouts comprising respective disjoint subsets of the segments, with each of the sub-layouts of the decomposed layout being associated with a different pattern mask of a double patterning lithography process. The layout decomposition process advantageously minimizes the number of stitches between the sub-layouts without introducing excessive computational complexity.

9 Claims, 4 Drawing Sheets

(a)

(b)

(c)

(d)

(e)

(f)

LAYOUT DECOMPOSITION METHOD AND APPARATUS FOR MULTIPLE PATTERNING LITHOGRAPHY

FIELD OF THE INVENTION

The present invention relates generally to semiconductor integrated circuit design and manufacture, and more particularly to techniques for generating circuit layouts in an integrated circuit design process.

BACKGROUND OF THE INVENTION

As integrated circuit device dimensions continue to shrink, it is becoming increasingly difficult to form circuit features and other layout shapes using conventional single pattern lithography processes. The recent development of extreme ultra violet (EUV) single pattern lithography processes will potentially allow the accurate patterning of ultra deep submicron shapes, but there remain significant difficulties in the practical implementation of these EUV processes.

An alternative approach to extending the range of conventional lithography processes is known as double patterning technology (DPT). The DPT approach generally involves decomposing the layout of a given layer of an integrated circuit design into two separate sub-layers each of which is associated with different pattern mask. The two pattern masks are separately exposed but collectively form the desired features or other shapes of the overall layout.

The decomposition process may separate certain continuous shapes into segments, such that segments that are within a specified minimum distance of one another are placed in different sub-layers. Two connected segments of the layout printed using the separate masks overlie one another at a point referred to as a "stitch." This is the point where the two segments printed in different masks overlay to form the original continuous shape. Thus, the DPT approach requires accurate overlay control between the segments in the two masks. Such overlay control is particularly challenging in view of rounding errors that typically arise at the ends of actual printed shapes at the stitch locations due to the lithography process, and the difficulty of the overlay control increases with the number of stitches. Therefore, it is very important to reduce the number of stitches in a decomposition.

Known techniques for reducing the number of stitches in a decomposition typically utilize either an Integer Linear Programming (ILP) approach or a heuristics approach. Examples of the ILP approach include techniques described in A. Kahng et al., "Layout decomposition for double patterning lithography," ICCAD 08, pp 465-472, 2008, and K. Yuan et al., "Double patterning layout decomposition for simultaneous conflict and stitch minimization," ISPD 09, pp 107-114, 2009. Examples of the heuristics approach include the techniques disclosed in J. S. Yang et al., "A new graph-theoretic, multi-objective layout decomposition framework for double patterning lithography," ASPDAC 10, pp 637-644, 2010.

However, obtaining optimal decompositions using the ILP approaches is unduly complex and time-consuming, and therefore such approaches are generally not suitable for use with layouts that include very large numbers of circuit features and other shapes. The heuristics approaches are also problematic in that such approaches tend to result in sub-optimal decompositions, that is, decompositions in which the number of stitches is not minimized.

Accordingly, a need exists for improved layout decomposition techniques which can reduce the number of stitches in an optimal manner and yet exhibit significantly reduced complexity relative to ILP approaches.

SUMMARY OF THE INVENTION

Illustrative embodiments of the present invention provide improved techniques for decomposing an integrated circuit design layout into multiple sub-layouts suitable for use in a multiple patterning lithography process.

In one aspect, an initial layout of at least a portion of a given layer of an integrated circuit design is decomposed into multiple sub-layouts by splitting each of a plurality of shapes of the initial layout into multiple segments, constructing a constraint graph to represent relationships between the segments, reducing the constraint graph to a stitch graph, determining at least one cut line of the stitch graph, and generating a decomposed layout based on the determined cut line.

The decomposed layout in an illustrative embodiment includes at least first and second sub-layouts comprising respective disjoint subsets of the segments, with each of the sub-layouts of the decomposed layout being associated with a different pattern mask of a multiple patterning lithography process. For example, two sub-layouts are generated for use with a DPT process.

One or more of the illustrative embodiments advantageously provide optimal minimization in the number of stitches between the segments of the multiple sub-layouts, while also providing a substantially reduced complexity which is given generally by $O(n^{1.5} \log n)$, where n denotes the number of segments in the layout after separation of each of its shapes into one or more segments. Using the techniques disclosed herein, the problem of minimizing the number of stitches, which is believed to be NP-hard using conventional ILP approaches, can be reduced to a min-cut problem on a planar graph, resulting in a highly efficient decomposition process that is even faster than conventional heuristics approaches.

These and other features and advantages of the present invention will become more apparent from the accompanying drawings and the following detailed description.

DETAILED DESCRIPTION OF PREFERRED EMBODIMENTS

The present invention will be illustrated herein in conjunction with exemplary integrated circuit design systems and associated techniques for generating circuit layouts. It should be understood, however, that the invention is not limited to use with the particular types of systems and techniques disclosed. The invention can be implemented in a wide variety of other types of design systems, using alternative circuit layout generation techniques. For example, although illustrated herein primarily in the context of DPT techniques, which generally involve decomposing a given layout into first and second sub-layouts, the disclosed arrangements can be adapted in a straightforward manner for use with other types of multiple patterning lithography processes, including those involving decomposition into three or more sub-layers.

Figure 1:
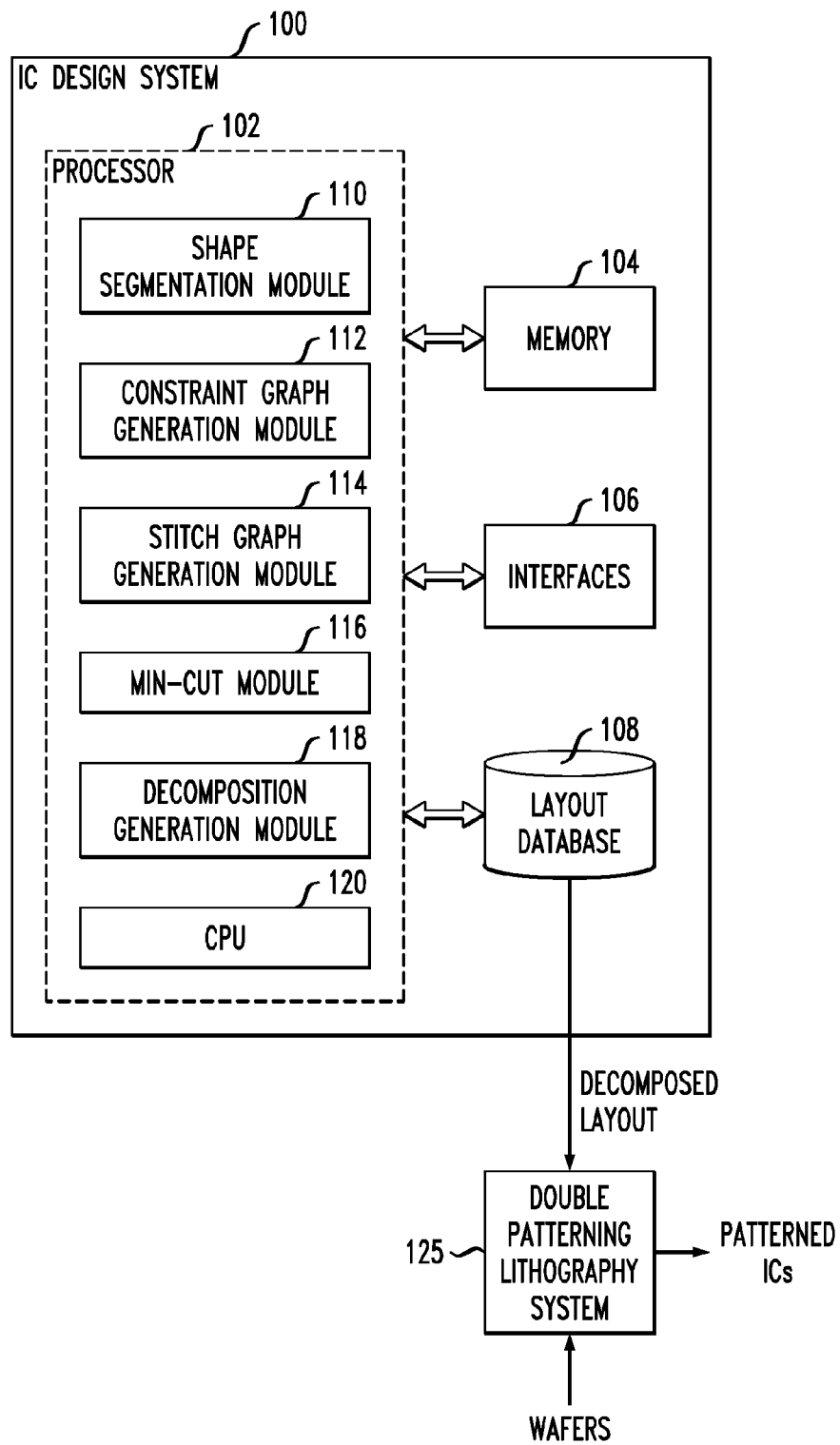
FIG. 1 is a block diagram showing an integrated circuit design system with double patterning layout decomposition functionality in an illustrative embodiment of the invention.

FIG. 1 shows an integrated circuit (IC) design system 100 in an illustrative embodiment of the invention. The system comprises a processor 102, which is coupled to memory 104, interfaces 106 and layout database 108. The processor 102 comprises a plurality of modules 110-118 for processing a layout of at least a portion of a given layer of an integrated circuit design. The modules may be executing under the control of a central processing unit (CPU) 120 of the processor. The processor 102 obtains an initial layout from the layout database 108, and processes the initial layout to generate a decomposed layout that comprises first and second sub-layouts each associated with a different pattern mask of a double patterning lithography process. The decomposed layout is provided to a double patterning lithography system 125, which uses the decomposed layout to pattern wafers in conjunction with the production of patterned integrated circuits.

An integrated circuit design will generally include several layers, and these may include, for example, diffusion layers, polysilicon layers and metal layers, as well as other types of layers, in any combination. A given layer generally comprises a set of shapes, which may include rectangles or other polygons, or other types of shapes, again in any combination. As previously described herein, the use of DPT techniques to print such layers in manufacturing an integrated circuit generally involves decomposing each layer into two separate sub-layers. The two separate sub-layers of a given layer are then printed using separate pattern masks so as to collectively provide the combined set of shapes of that layer.

The decomposition process will be illustrated below in conjunction with FIGS. 2, 3 and 4 as applied to at least a portion of a single layer of an integrated circuit design, but it is to be understood that similar decomposition processes may also be applied to other layers of the integrated circuit design in manufacturing the corresponding integrated circuit.

The modules implemented by processor 102 in the present embodiment include a shape segmentation module 110, a constraint graph generation module 112, a stitch graph generation module 114, a min-cut module 116, and a decomposition generation module 118. The shape segmentation module 110 is configured to split each of a plurality of shapes of the layout into multiple segments. The constraint graph generation module 112 is configured to construct a constraint graph representing relationships between the segments. The stitch graph generation module 114 is configured to reduce the constraint graph to a stitch graph. The min-cut module 116 is configured to determine at least one cut line of the stitch graph. The decomposition generation module 118 is configured to generate a decomposed layout based on the determined cut line. The operation of these modules in decomposing an initial layout into separate sub-layouts for use in the double patterning lithography system 125 will be described in greater detail in conjunction with FIG. 2.

The processor 102 and one or more additional components of system 100 such as memory 104 and interfaces 106 may be part of a computer, server or other type of processing device. One or more of the modules 110-118 in FIG. 1 may be implemented at least in part in the form of software that is stored in memory 104 and executed by processor 102.

The memory 104 is an example of what is more generally referred to herein as a computer program product having embodied therein executable program code, and may comprise electronic memory such as RAM or ROM, magnetic memory, disk-based memory, optical memory or other types of storage elements, in any combination. The processor 102 may comprise one or more microprocessors, microcontrollers, application-specific integrated circuits (ASICs), field programmable gate arrays (FPGAs), graphical processing units (GPUs) or other processing devices, in any combination, for executing program code stored in memory 104. As noted above, the modules 110-118 may be implemented at least in part in the form of such program code.

The interfaces 106 may comprise, for example, user interfaces such as displays, keyboards and other input-output devices, as well as network interfaces for interfacing processor 102 with other system elements over one or more networks.

It is to be appreciated that the particular arrangements of design system 100 and lithography system 125 as shown in FIG. 1 are presented by way of illustrative example only. Alternative embodiments may include other arrangements of system elements suitably configured to support decomposition of integrated circuit design layouts in the manner described herein.

The processor 102 and its associated memory 104 or portions thereof may be implemented at least in part in the form of an integrated circuit. For example, in a given implementation the processor 102 may be embodied in a single ASIC or other type of processing device, such as, for example, an FPGA, GPU, computer, server, mobile communication device, etc.

Figure 2:
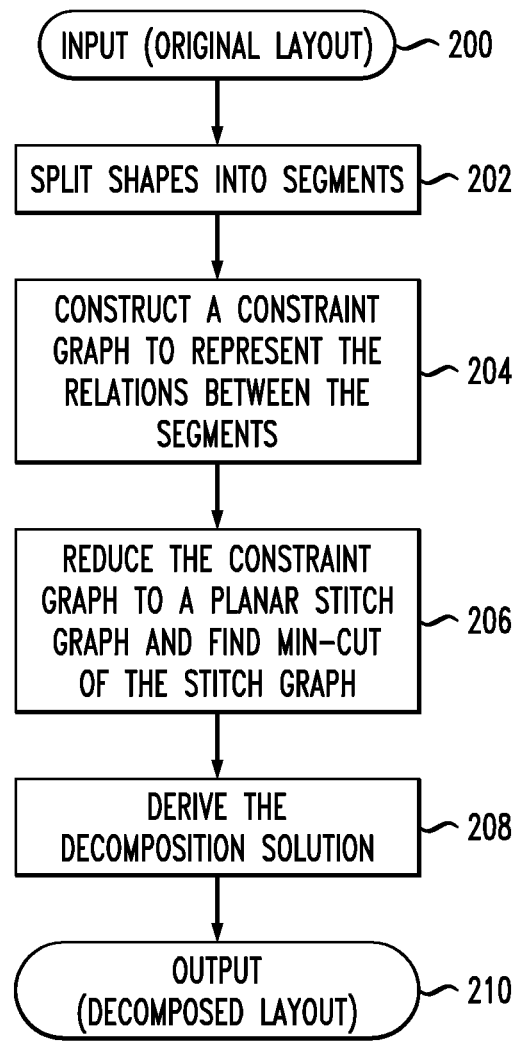
FIG. 2 is a flow diagram of a double patterning layout decomposition process implemented in the integrated circuit design system of FIG. 1.

Referring now to FIG. 2, a flow diagram of the decomposition process implemented in design system 100 is shown. The process in this particular embodiment includes steps 200 through 210, each of which will be described below. The process generally decomposes a layout into two sub-layouts suitable for use in double patterning lithography system 125, in a manner that minimizes the number of stitches without introducing excessive computational complexity. As noted previously, a stitch is introduced if two touching segments from the same shape in the original layout are assigned to different sub-layouts. Given the original layout and a specified threshold distance, the decomposition process of FIG. 2 determines a decomposed layout having two sub-layouts comprising respective disjoint subsets of the segments, such that no two segments within the same subset are closer to one another than the threshold distance, the union of the two subsets of segments is equivalent to the original layout, and the number of stitches is minimized.

Figure 3:
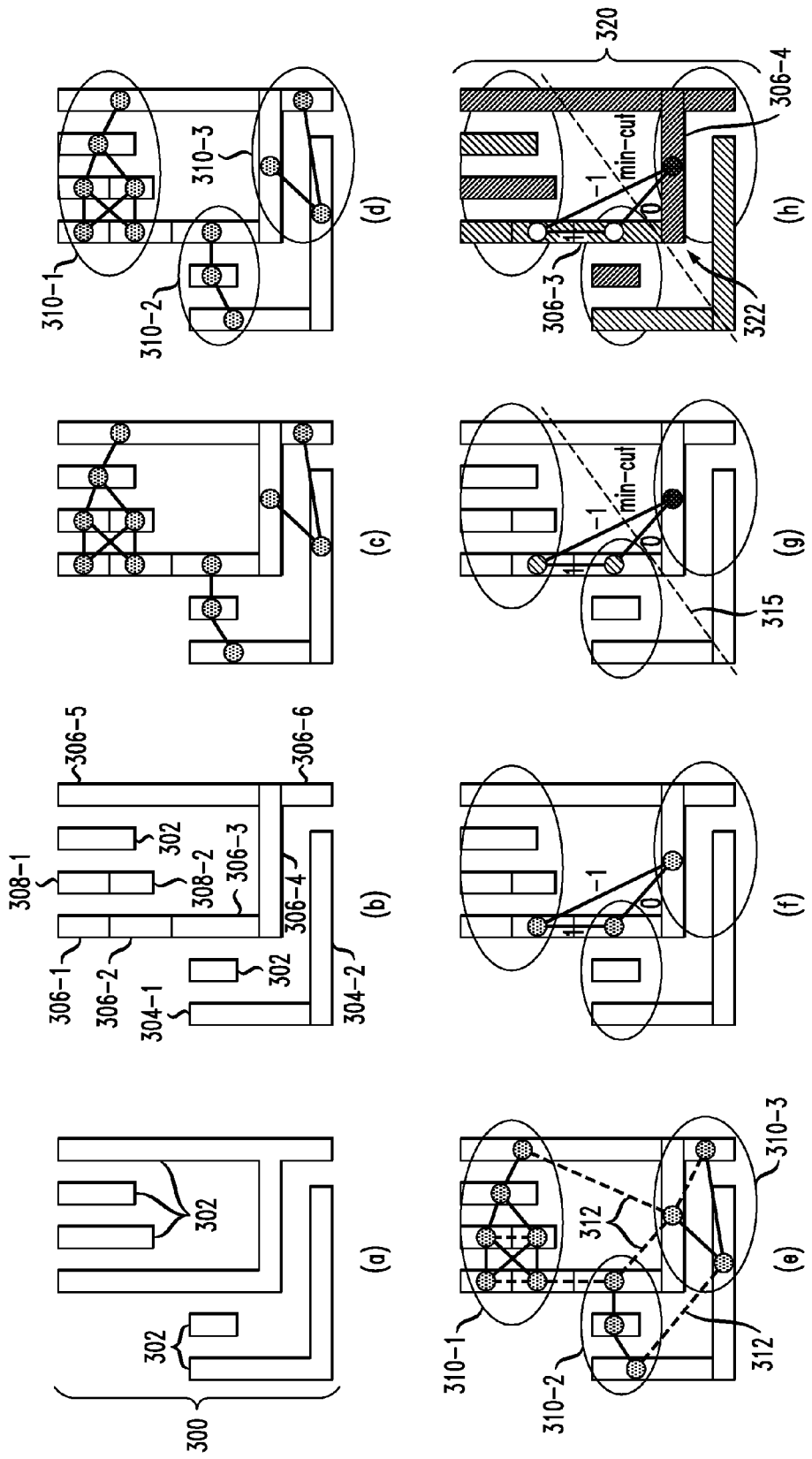
FIGS. 3(a) through 3(h) illustrate the layout decomposition process of FIG. 2 as applied to an exemplary portion of an integrated circuit layout.
Figure 4:
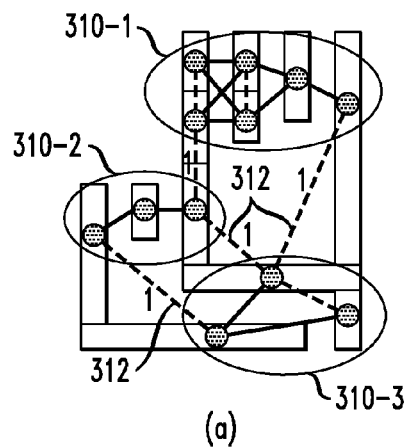
FIGS. 4(a) through 4(f) illustrate in greater detail the computation of a stitch graph as part of the FIG. 3 layout decomposition process.
Figure 4:
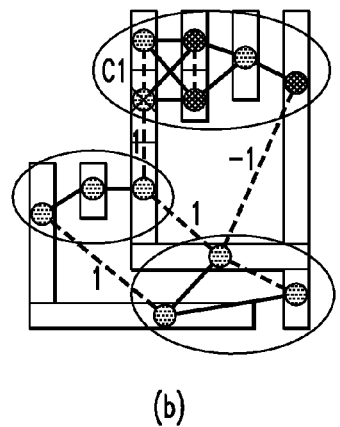
Figure 4:
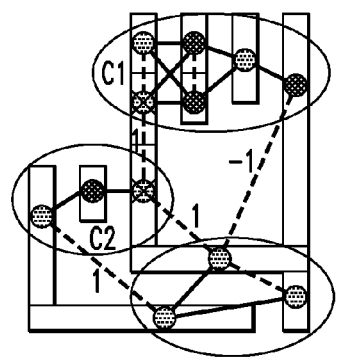
Figure 4:
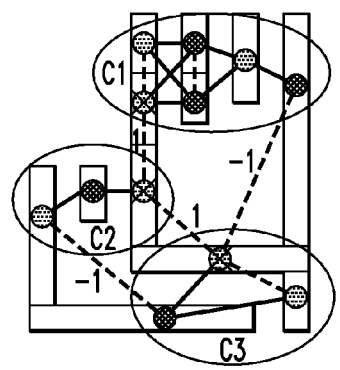
Figure 4:
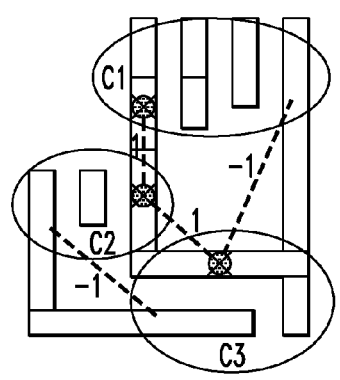
Figure 4:
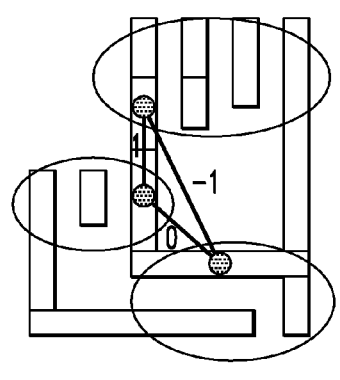

In describing the various steps of the flow diagram of FIG. 2, reference will also be made to corresponding portions of FIG. 3, which illustrate a detailed example of the decomposition process as applied to actual shapes of a layout.

In step 200, an original layout is obtained as input to the decomposition process. The original layout may be obtained, for example, from the layout database 108, or from any other source. The term "layout" as used herein is intended to be generally construed so as to comprise at least a portion of a given layer of an integrated circuit design. Also, terms such as "original" and "initial" as used herein with reference to a layout should not be construed as requiring any particular type or stage of layout, but are instead more generally intended to refer to a layout that is applied as an initial input to one or more steps of a decomposition process.

In step 202, at least a portion of the shapes of the layout are each split into two or more segments. A more particular example of this splitting operation can be seen with reference to FIGS. 3(a) and 3(b). As shown in FIG. 3(a), an original layout 300 comprises a plurality of shapes 302. Some of these shapes are separated into segments, while others are not separated and instead include only a single segment. The resulting split shapes are shown in FIG. 3(b). It is apparent that one shape is separated into two segments 304-1 and 304-2, another shape is separated into six segments denoted 306-1, 306-2, 306-3, 306-4, 306-5 and 306-6, and yet another shape is separated into two segments 308-1 and 308-2, while two of the shapes 302 are not further segmented but instead each includes only a single segment. Any of a number of well-known conventional techniques may be used to separate the shapes into segments, and such techniques will not be further described herein.

In step 204, a constraint graph is constructed to represent the relations between the segments. The constraint graph generally includes a node for each of the segments, and an arc between each pair of nodes for which a corresponding pair of non-contacting segments are within the specified threshold distance of one another. The term "non-contacting segments" in this context refers to segments that are not part of the same shape in the original layout. FIG. 3(c) shows the constraint graph for the segmented layout of FIG. 3(b). Each arc in the constraint graph indicates that the corresponding two segments are from different shapes and are in conflict with the minimum segment spacing requirement of the DPT lithography process, and will therefore need to be assigned to separate sub-layers of the decomposed layout. The arcs of the constraint graph are therefore also referred to herein as "conflict arcs."

If there are no odd cycles in the constraint graph, the constraint graph is referred to herein as a "2-colorable" graph and the corresponding original layout is decomposable into two sub-layouts, each including the segments for one of the two DPT pattern masks. Thus, of the two disjoint subsets of segments in the respective sub-layouts of the decomposed layout generated by the FIG. 2 process, one subset will be associated with one of the two colors of the 2-colorable graph, and the other will be associated with the other color of the 2-colorable graph. The decomposition process may therefore be viewed as assigning one of the two colors to each of the segments of the layout.

For purposes of the present description, it will be assumed for simplicity and clarity that the original layout of step 200 is decomposable. In the example constraint graph of FIG. 3(c), there are no odd cycles, so the graph is 2-colorable and the layout 300 is decomposable.

In step 206, the constraint graph is reduced to a planar stitch graph and a minimum cut line ("min-cut") of the stitch graph is determined. In the present embodiment, determination of the min-cut of the stitch graph serves to minimize the number of stitches in the resulting decomposition, as will be described in greater detail below.

The reduction of the constraint graph into a planar stitch graph involves first grouping the nodes of the constraint graph into components based on the conflict arcs. A component may be defined as follows: between any two nodes of a component, there exists a path of conflict arcs such that the two nodes are connected, and between any two nodes of different components, there exists no connecting path of conflict arcs. Thus, the colors for a component in a 2-colorable graph are alternating. Once any node within a given component is assigned to certain color, all other nodes in the component are determined. Therefore, there are only two choices in total to assign colors to a component.

FIG. 3(d) shows the constraint graph of FIG. 3(c) with the nodes separated into three separate components 310-1, 310-2 and 310-3. It can be seen that the nodes within a given component are connected by paths of conflict arcs, while the nodes in different components are not connected by paths of conflict arcs.

Stitch arcs are then added between nodes of respective segments that are in contact with one another (i.e., part of the same shape in the original layout) to represent potential stitches between the first and second sub-layouts of the decomposed layout. FIG. 3(e) shows the addition of such stitch arcs between the contacting segments, as dashed lines 312. If the two nodes connected by a stitch arc are eventually assigned to different colors, then the stitch arc represents a true stitch. Otherwise, the stitch arc represents a false stitch. It can be shown that the number of stitches within a given component is a constant.

The constraint graph is then reduced to a stitch graph by selecting one node in each of the components as a representative node. The stitch graph therefore includes only one node for each of the components of the constraint graph. FIG. 3(f) shows a stitch graph generated for the constraint graph having the components 310 and stitch arcs 312 shown in FIG. 3(e). The stitch graph of FIG. 3(f) includes only three nodes, one for each of the three components 310-1, 310-2 and 310-3 of the corresponding constraint graph. It can be shown that the stitch graph is planar. However, the constraint graph is not necessarily planar, even if it is assumed to be 2-colorable.

In constructing the stitch graph, any node $r_i$ in component i may be picked to represent that component. Also, an arc a in the stitch graph represents a connection between a representative node $r_1$ in a first one of the components and a representative node $r_2$ in a second one of the components. Associated with arc a is a cost given by $s[c(r_1) \neq (c(r_2)] - s[c(r_1) = c(r_2)]$, where s denotes number of stitches and c denotes color. Thus, the cost of arc a is given by the number of stitches across the two components when the two representative nodes have different colors minus the number of stitches when the two representative nodes have the same color. The cost of an arc can therefore be positive or negative.

The algorithm ConstructStitchGraph below computes a stitch graph from the constraint graph based on the above rules.

Algorithm ConstructStitchGraph
1. Start with the constraint graph including all segment nodes and stitch arcs, and assign each potential stitch arc an initial cost of 1.
2. For each component:
   (a) pick a representative node for the component and assign a color to that node;
   (b) assign alternating colors to all other nodes of the component; and
   (c) when a node has a different color than the representative node, invert the costs of its adjacent arcs.
3. For each component:
   (a) merge all of the nodes for each component into the representative node for that component; and
   (b) after merging nodes, if there are multiple arcs between components, merge any such arcs into one arc between the representative nodes that has a cost which is the sum of the costs of the merged arcs.

It can be shown that the above algorithm ConstructStitchGraph correctly computes a stitch graph from a constraint graph, and has a runtime which is linear in the number of nodes of the constraint graph. The sum cost for a given merged arc is the number of stitches across the two components when the two representative nodes have different colors minus the number of stitches when the two representative nodes have the same color.

Additional details regarding construction of the stitch graph from the constraint graph will now be described with reference to the example of FIG. 4, which shows the steps involved in computing the stitch graph of FIG. 3(f) from the constraint graph with components 310 and stitch arcs 312 of FIG. 3(e). FIG. 4(a) shows the constraint graph of FIG. 3(e) with initial costs of 1 assigned to each of the stitch arcs 312. FIG. 4(b) shows the graph after performing the inverting step for component 310-1, also denoted as component C1. The node with an "X" mark indicates the representative node of the component. Similarly, FIG. 4(c) shows the graph after performing the inverting step for component 310-2, also denoted as component C2, and FIG. 4(d) shows the graph after performing the inverting step for 310-3, also denoted as component C3. FIG. 4(e) shows the graph after merging the nodes for each component C1, C2 and C3. Finally, FIG. 4(f) shows the stitch graph obtained after merging the multiple arcs between the components, as also shown in FIG. 3(f).

After the stitch graph is constructed in the manner described above, the min-cut of the stitch graph is determined. The cut of a graph may be defined in the following manner. Assume a graph G=(N, A), where N is the set of nodes in graph G and A is the set of arcs between those nodes. A cut of the graph G is a set of arcs {(u, v)} such that there exists a partition of N, given by (S, N−S), in which one of the endpoints (e.g., u) is in S (S⊂N) and the other (e.g., v) is in N−S. The value of a cut is the sum of all the costs of the arcs. It can be shown that any cut of the stitch graph corresponds to a valid assignment of colors to all segments, and vice versa. Also, the value of the min-cut of the stitch graph is less than or equal to 0.

Furthermore, it can be shown that the total number of stitches for an assignment of colors is equal to the number of stitches within each component plus the number of stitches across components. The number of stitches across components is equal to the number of stitches across components when all representative nodes are assigned to the same color plus the value of the cut of the stitch graph.

It should be noted that the number of stitches across components when all representative nodes are assigned to the same color is actually equal to the number of −1's after the inverting step in the algorithm ConstructStitchGraph. For a given choice of representative nodes for all components, the number of stitches across components when all representative nodes are assigned to the same color is a fixed number. Therefore, the min-cut in the stitch graph gives the decomposition solution to the original layout with the minimum number of stitches. FIG. 3(g) shows the min-cut 315 for the stitch graph of FIG. 3(f).

Examples of techniques that may be used to determine the min-cut of a planar graph for arbitrary costs are described in W. K. Shih et al., "Unifying maximum cut and minimum cut of a planar graph," IEEE Trans. Comput. 39(5), pp 694-697, 1990, and F. Liers et al., "A simple max-cut algorithm for planar graphs," Technical Report, Germany, September 2008. It should be pointed out in this regard that a min-cut with arbitrary costs is commonly referred to as a max-cut. By inverting the cost of each arc, a min-cut problem may be converted to a max-cut problem.

A number of techniques may be used to speed up the computation of the min-cut of the stitch graph. For example, the stitch graph usually contains a number of connected components. Therefore, the min-cut may be determined by first determining a component min-cut separately for each of the components of the stitch graph, and then combining the component min-cuts to determine the min-cut for the stitch graph. As another example, isolated nodes can be identified and excluded from the min-cut computation. Isolated nodes are nodes of degree zero, i.e., nodes that have no connected arcs.

It is also possible to speed up the min-cut computation by identifying bridges, where a bridge of a graph is an arc whose removal disconnects the graph or the component of the graph. Since removing a bridge divides a component into two new components, the min-cut for the two new components is independent. Bridges with positive costs should not be included in the min-cut, while bridges with negative costs should be included. Therefore, one can identify all bridges with negative costs, put them in a pre-computed min-cut result, and then safely remove all bridges before completing the min-cut computation. Bridges in a graph can be identified directly in linear time using well-known conventional approaches. Bridges in a planar stitch graph can also be readily identified by identifying self-loops in a corresponding dual graph, as the bridges in the planar stitch graph become self-loops in the dual graph, where a self-loop denotes an arc that connects a node to itself.

As indicated previously, the above-described construction of the stitch graph from the constraint graph and the determination of the min-cut line of the stitch graph are part of step 206 of the FIG. 2 flow diagram.

In step 208, the decomposition solution is derived for the original layout based on the min-cut line of the stitch graph. After finding the min-cut result, the representative nodes of the respective components are colored by the min-cut. Then the alternating colors are assigned to the other nodes for each component. A DPT decomposition solution is thereby obtained with an optimal number of stitches. The decomposed layout 320 for the FIG. 3 example is illustrated in FIG. 3(h). It can be seen that there is only one stitch 322 for the decomposition, between segment 306-3 in one of the sub-layers and segment 306-4 in the other sub-layer.

In step 210, the decomposed layout is output, and the process is complete. The decomposed layout may be stored in the layout database 108.

The particular layout decomposition process shown in FIG. 2 is presented by way of illustration only, and other embodiments may utilize other arrangements of process steps to generate a decomposed layout.

The layout decomposition techniques disclosed herein can advantageously provide optimal minimization in the number of stitches between the segments of multiple sub-layouts, while also providing a substantially reduced complexity which is given generally by $O(n^{1.5} \log n)$, where n denotes the number of segments in the original layout after separation of each of its shapes into one or more segments. Using the techniques disclosed herein, the problem of minimizing the number of stitches, which is believed to be NP-hard using conventional ILP approaches, can be reduced to a min-cut problem on a planar graph, resulting in a highly efficient decomposition process that is even faster than conventional heuristics approaches.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. A given computer readable medium of this type may be part of or otherwise associated with a processor such as the above-noted ASICs or FPGAs.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, RAM, ROM, an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). A given computer or server may comprise one or more processors, such as the above-noted GPUs.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should therefore again be emphasized that the various embodiments described herein are presented by way of illustrative example only, and should not be construed as limiting the scope of the invention. For example, alternative embodiments of the invention can utilize different integrated circuit design system configurations, and different layout generation processes, than those described above in the context of the illustrative embodiments. These and numerous other alternative embodiments within the scope of the appended claims will be readily apparent to those skilled in the art.

What is claimed is:

1. A method comprising:

obtaining an initial layout of at least a portion of a given layer of an integrated circuit design from a database;

splitting each of a plurality of shapes of the layout from the database into multiple segments;

constructing a constraint graph to represent relationships between the segments, wherein the constructing step comprises constructing the constraint graph as a two-colorable constraint graph in which segment nodes represent respective ones of the segments and a conflict arc between a given pair of the segment nodes indicates that the corresponding segments are from different shapes and are within a specified threshold distance of one another;

reducing the constraint graph to a stitch graph, wherein the reducing step comprises the step of forming components as respective groups of the segment nodes of the constraint graph such that those segment nodes within a given component of the formed components are connected by conflict arcs and those segment nodes in different components of the formed components are not connected by the conflict arcs;

determining at least one cut line of the stitch graph; and generating a decomposed layout based on the determined cut line;

wherein the obtaining, splitting, constructing, reducing, determining and generating steps are performed by a processing device comprising a processor coupled to a memory; and wherein the decomposed layout is provided to a lithography system to pattern a wafer based on the decomposed layout.

2. The method of claim 1 wherein the decomposed layout comprises first and second sub-layouts comprising respective disjoint subsets of the segments.

3. The method of claim 2 wherein each of the sub-layouts of the decomposed layout is associated with a different pattern mask of a subsequent double patterning lithography process.

4. The method of claim 1 wherein the reducing step further comprises the steps of:

adding stitch arcs between nodes of respective segments that are in contact with one another to represent potential stitches between first and second sub-layouts of the decomposed layout;

assigning initial costs to the stitch arcs;

selecting one segment node in each of the respective groups of the segment nodes as a representative segment node for the corresponding component and assigning a color to that representative segment node;

assigning alternating colors to all other segment nodes of each of the components;

when a given segment node has a color that differs from that of the representative segment node, inverting the costs assigned to its adjacent stitch arcs;

merging the segment nodes of each component into the corresponding representative segment node; and merging each of one or more sets of multiple stitch arcs between the components by summing their costs into a single stitch arc of the stitch graph.

5. The method of claim 4 wherein the stitch graph comprises a planar stitch graph in which any cut line of the planar stitch graph comprises a valid assignment of colors to the segments.

6. The method of claim 5 wherein the determined cut line comprises a minimum cut line of the stitch graph that minimizes a number of said stitches between the first and second sub-layouts of the decomposed layout.

7. The method of claim 6 wherein the minimum cut line is determined by determining a component minimum cut line separately for each of the components of the stitch graph and combining the component minimum cut lines to determine the minimum cut line for the stitch graph.

8. The method of claim 4 wherein a given stitch arc a in the stitch graph represents a connection between a representative node $r_1$ in a first one of the components and a representative node $r_2$ in a second one of the components, and associated with stitch arc a is a cost given by $s[c(r_1) \neq (c(r_2)] - s[c(r_1) = c(r_2)]$, where s denotes number of stitches and c denotes color, such that the cost of stitch arc a is given by the number of stitches across the two components when the two representative nodes have different colors minus the number of stitches when the two representative nodes have the same color.

9. The method of claim 1 further comprising the step of manufacturing an integrated circuit in accordance with the design by performing multiple patterning lithography operations utilizing the decomposed layout.

\* \* \* \* \*